United States Patent [19]

Vaught

[11] Patent Number: 5,023,424
[45] Date of Patent: Jun. 11, 1991

[54] SHOCK WAVE PARTICLE REMOVAL METHOD AND APPARATUS

[75] Inventor: John L. Vaught, Palo Alto, Calif.

[73] Assignee: Tencor Instruments, Mountain View, Calif.

[21] Appl. No.: 467,974

[22] Filed: Jan. 22, 1990

[51] Int. Cl.⁵ .............................................. B23K 26/00
[52] U.S. Cl. .......................... 219/121.6; 219/121.68; 219/121.69
[58] Field of Search ........... 219/121.6, 121.68, 121.65, 219/121.85, 121.8

[56] References Cited

U.S. PATENT DOCUMENTS

| | | | |
|---|---|---|---|
| 3,180,418 | 4/1965 | MacLeod | 166/43 |
| 3,429,743 | 2/1969 | Branson | 134/1 |
| 3,481,784 | 12/1969 | Karpovich | 134/1 |
| 4,089,702 | 5/1978 | Enoksson et al. | 134/1 |
| 4,115,683 | 9/1978 | Clark et al. | 219/121.7 |
| 4,377,735 | 3/1983 | Minamida et al. | 219/121.6 X |
| 4,601,576 | 7/1986 | Galbraith | 356/237 |
| 4,671,848 | 6/1987 | Miller et al. | 219/121.85 X |
| 4,752,668 | 6/1988 | Rosenfield et al. | 219/121.68 |
| 4,756,765 | 7/1988 | Woodroffe | 134/1 |
| 4,839,493 | 6/1989 | Herziger et al. | 219/121.85 X |

Primary Examiner—C. L. Albritton
Attorney, Agent, or Firm—Thomas Schneck; Mark Protsik

[57] ABSTRACT

An apparatus and method using laser induced shock waves to dislodge particles from a wafer surface. The apparatus includes a wafer support, a particle detector and computer for locating and storing the locations of particles on the wafer, a laser, and focusing optics. Laser beam pulses are directed toward the wafer surface at a shallow angle or with a large beam convergence angle to avoid damage to the wafer.

12 Claims, 2 Drawing Sheets

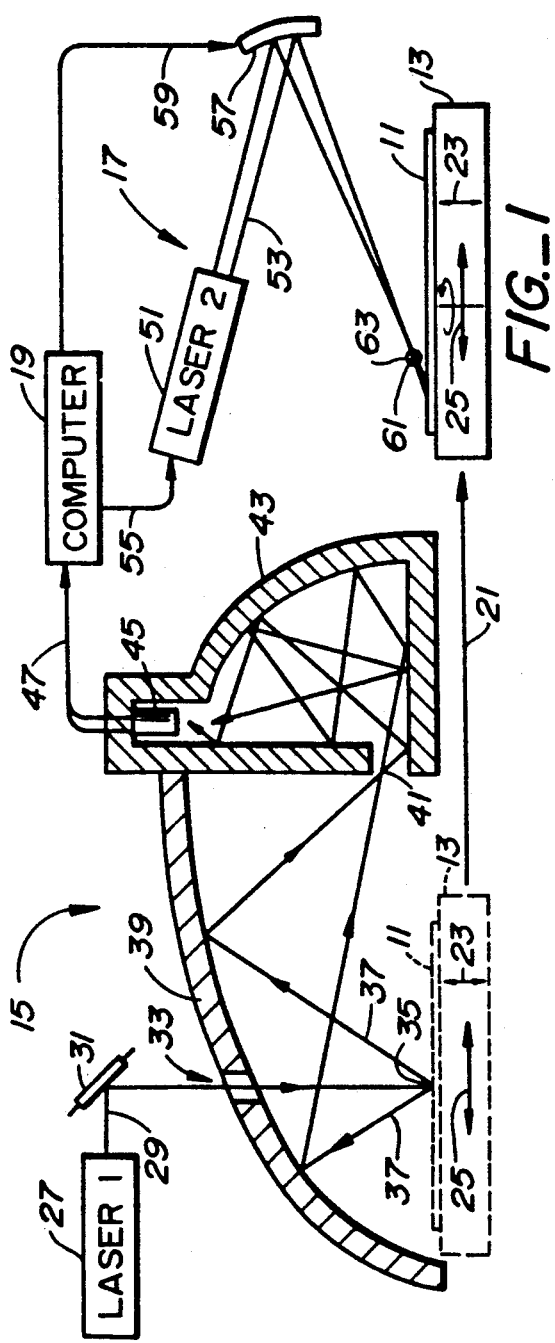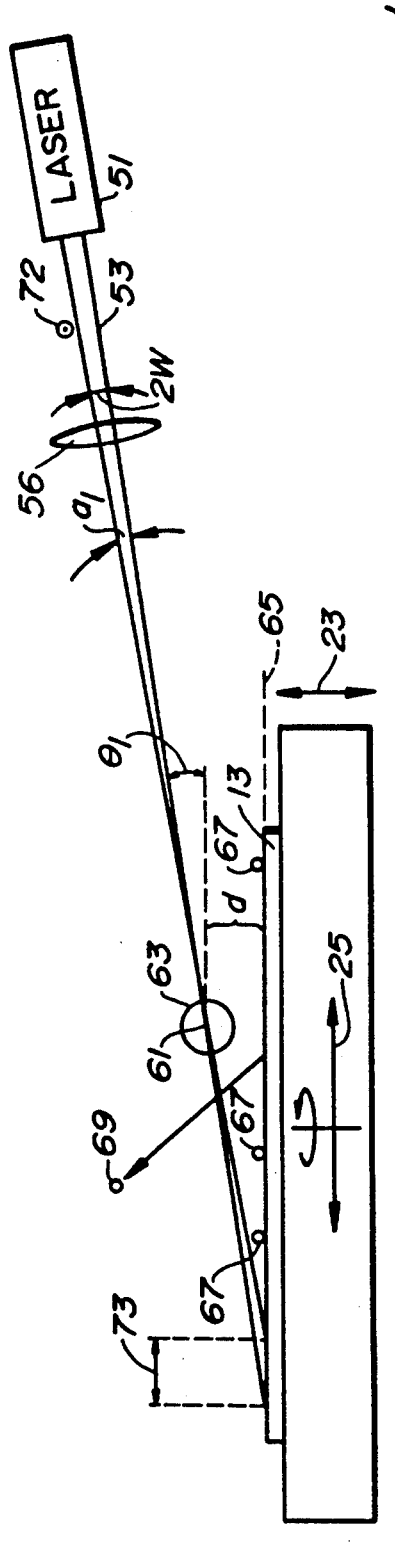

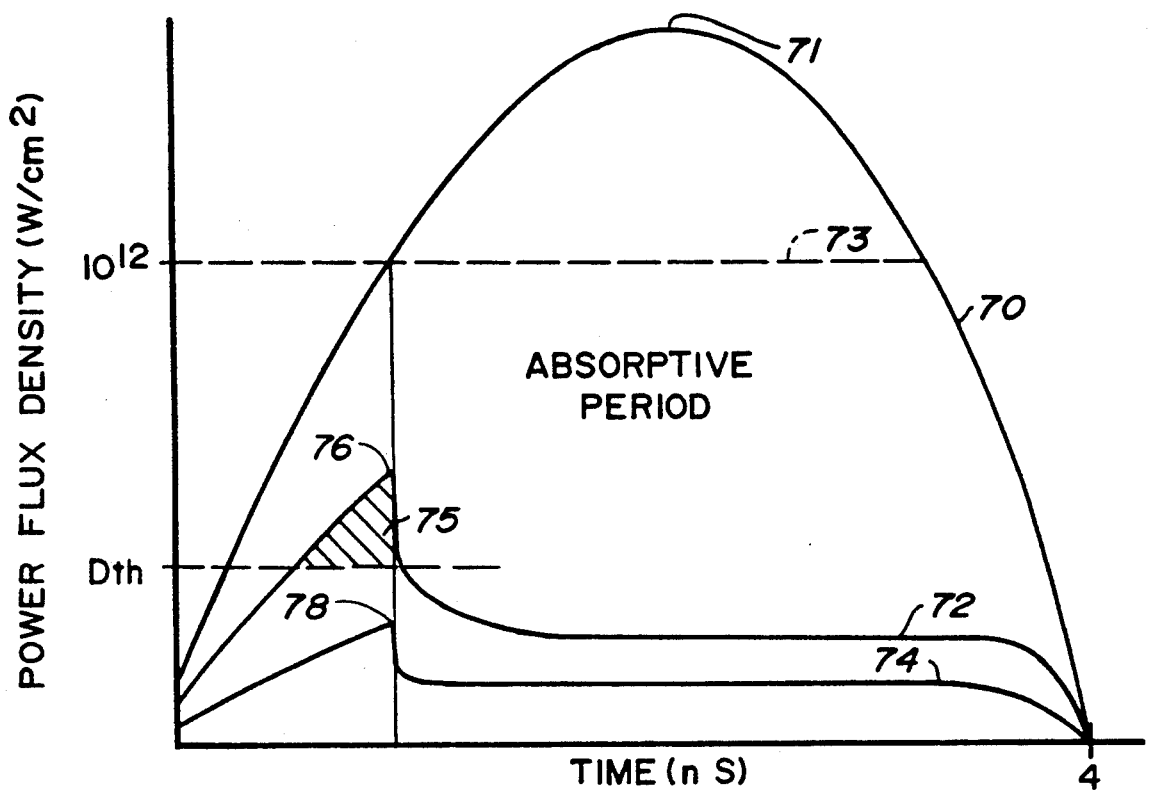
FIG._3
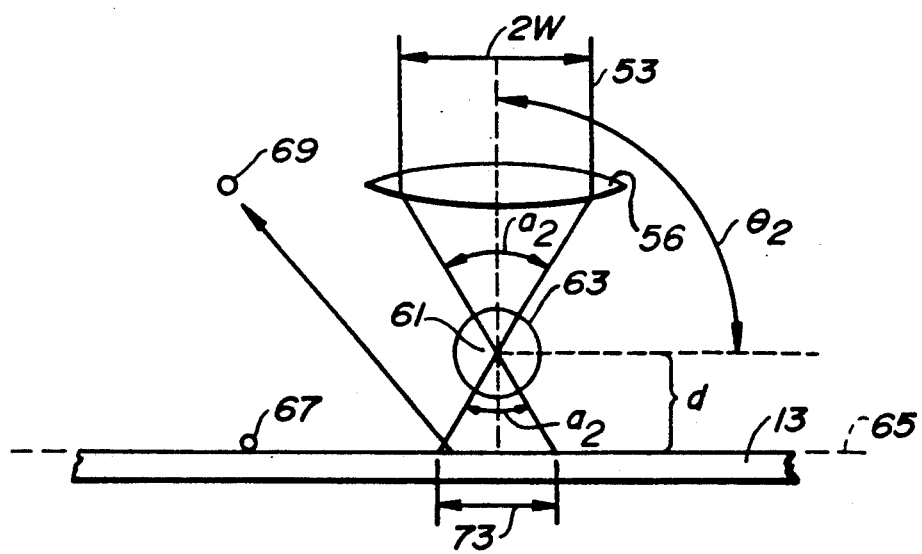
FIG._4

SHOCK WAVE PARTICLE REMOVAL METHOD AND APPARATUS

DESCRIPTION

1. Technical Field

The present invention relates to surface cleaning of semiconductor wafers, masks, reticles and other solid surfaces and in particular to methods and apparatus for removing microscopic particles and like contaminating residue from these solid surfaces.

2. Background Art

In the manufacture of semiconductor integrated circuits, effort must be made to keep the wafers containing such circuits free from contaminating particles. Because particles from the air, as well as from human handlers, tend to accumulate on the wafer surface, even in the cleanest of rooms, the wafers must be cleaned regularly during the fabrication process. A single particle in the wrong location can be fatal to a circuit or "chip" on a wafer. Likewise, masks and reticles used in the wafer patterning process must also be kept clean, since a single particle on a mask or reticle will be patterned onto each circuit formed on the wafer.

Presently, wafers, masks and reticles are cleaned using chemical and ultrasonic cleaning steps. The liquids used in these steps have a low, but not insignificant, dissolved solid content. Since it is generally impossible to remove all of the liquid from a surface by nonevaporative methods, some of the dissolved solids are always found deposited on the surface after the last rinse step. This is true no matter how many times the surface is repeatedly cleaned. The particles may be found at different locations after each rinse, but the wafers, masks or reticles will continue to average the same number of particles independent of the number of cleanings.

In U.S. Pat. No. 3,180,418, MacLeod describes a method and apparatus for cleaning bulk articles, for example, removing scale from boiler tanks or from the casing of a well, by generating shock waves by means of an electrical discharge in a liquid. In one embodiment, the spark discharge in a gap between two graphite electrodes creates a dispersion of graphite particles which facilitates the initiation of successive discharges through the liquid. In other embodiments, electrolytes or fine metal powders are introduced into the liquid to enhance the conductivity in the spark gap.

In U.S. Pat. No. 3,429,743, Branson teaches a similar method and apparatus for cleaning an article surface immersed in a liquid, using an electrical spark gap discharge to generate high intensity shock waves in the liquid. Branson teaches that the liquid should be degassed ultrasonically prior to shock wave generation for more forceful propagation of the shock waves.

Karpovich, in U.S. Pat. No. 3,481,784, generates shock waves in a liquid for the purpose of cleaning objects by introducing a low boiling point liquid to another liquid which has a higher boiling point and which is heated to a temperature above the lower boiling point. This causes superheating followed by explosive boiling of the lower boiling point liquid. Karpovich teaches that the two liquids are preferably immiscible. Although useful for removing scale, rust or other macroscopic particles from generally durable articles, the immersion in a liquid means that these methods are no more suitable for removing small numbers of microscopic particles from semiconductor wafers or other delicate surfaces than ultrasonic methods.

In U.S. Pat. No. 4,089,702, Enoksson et al. describe the removal of particles from internal cavity surfaces of an object by detonating an explosive gas that has been introduced into the cavities of the object.

In U.S. Pat. No. 4,115,683, Clark et al. describe a method of perforating holes in a brittle board material which uses a laser. The laser beam is directed at the workpiece and ionizes compressed gas over the workpiece. As a consequence a shock wave having a high pressure wave front is produced. This shock wave, confined by the compressed gas, forms a hole through the material. The debris is removed by the action of the pressurized gas and a vacuum applied to a groove behind the workpiece. High pressure also reduces the beam power needed, so little heating of the workpiece takes place.

Lasers are also used to remove material coatings from surfaces. For example, U.S. Pat. Nos. 4,756,765 and 4,752,668 cause ablation of material to be removed by means of a beam directly impinging on the material. In U.S. Pat. No. 4,671,848, Miller et al. describe a method in which a dielectric surface coating is removed by focusing a laser beam to generate an ionized or plasma region in the vicinity of the coating. The high temperature produced by the laser-induced plasma will vaporize the nearby coating material. In one embodiment, the amount of radiation directly impinging on the coated body may be reduced by spatially removing it from the optic axis of the beam.

An object of the present invention is to provide a method and apparatus for removing microscopic particles from wafers, masks, reticles and the like without damaging the surface or contaminating already clean areas.

DISCLOSURE OF THE INVENTION

The above object has been met with a method and apparatus in which particles are removed from a surface by using a focused laser beam or other means to produce shock waves at points above the surface proximate to the particles. Each shock wave has a peak pressure gradient sufficient to dislodge and remove any particle on the surface in the vicinity of the shock wave's point of origin.

The apparatus includes a support for the wafer so that the wafer surface may be disposed in a predetermined plane for examination and particle removal. It may also include a particle detector for locating the positions of particles on the wafer surface. Shock wave producing elements may then produce shock waves at points just above the wafer surface, the points being selected, in response to the particle detector, to be proximate to the located particle positions. Alternatively, the shock wave producing elements may select a sequence of points proximate to the plane in a scan of the wafer surface without the need for detecting and locating individual particles. In a preferred embodiment, the shock wave producing elements include a laser for producing a selectively pulsed beam and optics for directing and focusing the beam to the selected points. The beam is focused with a numerical aperture or convergence angle large enough to produce gas breakdown at the focus, while being directed at an angle shallow enough to avoid damaging the wafer surface. The peak power flux density of a focused beam pulse is above the threshold at which breakdown of the gas occurs so that a high pressure shock wave originates at the focal point above the wafer surface.

The particle position locating and shock wave producing steps, or the scanning and shock wave producing steps, are repeated until all detectable particles are removed, or the entire wafer has been scanned.

BRIEF DESCRIPTION OF DRAWINGS

FIG. 1 is a simplified side view of an apparatus of the present invention for carrying out the method of removing particles from a wafer surface.

FIG. 2 is a schematic side view of a portion of the apparatus of FIG. 1 illustrating the shock wave method of the present invention.

FIG. 3 is a graph of the power flux density at the focus of a beam pulse with respect to time.

FIG. 4 is a schematic side view of a shock wave producing portion of the apparatus of FIG. 1, with a larger convergence angle a and larger incidence angle than in FIG. 2.

BEST MODE OF CARRYING OUT THE INVENTION

With reference to FIG. 1, an apparatus for removing particles from solid surfaces comprises a support 13 for an object 11, such as a wafer, a particle detector 15 for locating particle positions on wafer 11, shock wave producing elements 17 for removing particles from wafer 11, and a computer 19 responsive to particle detector 15 and controlling elements 17 to select shock wave points of origin. Particle detector 15 is optional, and in an alternate embodiment the computer 19 may simply control scanning of an entire wafer by shock wave producing elements 17.

While the object 11 having the solid surface is shown in the drawings as a semiconductor wafer and will be referred to hereafter as wafer 11, other damage sensitive solid surfaces requiring extreme cleanliness can also be used with the apparatus and method of the present invention. For example, the objects could include masks and reticles used in photolithography, high optical quality lens and mirror surfaces, magnetic and optical data storage disks, and large area liquid crystal display surfaces.

Support 13 may be any of the wafer handling and transport systems known in the art. Typically, support 13 would have several degrees of freedom of motion, such as the ability, indicated by arrow 21, to transport a wafer from a particle detector station, seen in phantom, to a particle removal station, to move a wafer surface into and out of a predetermined plane, as indicated by arrow 23, and to carry out a wafer scanning motion, as indicated by arrows 25. Such supports are widely available.

Particle position detector 15 may be any detector whereby the positions of particles on the wafer 11 can be located. One such detector is described in U.S. Pat. No. 4,601,576 to Galbraith. Briefly, that detector includes a laser light source 27 generating a narrow beam 29 and a scanning mirror 31 for sweeping the beam in a path across the wafer surface via a slot 33. Light 37 scattered from particles on the wafer 11 at a first focus 35 is specularly reflected by an ellipsoidal first stage light collector 39 to a second focus 41, which also serves as the entrance aperture to a second stage light collector 43. Collector 43, which may be a section of a hemisphere, diffusely reflects light entering through the aperture at focus 41 toward a detector 45. Alternatively, collector 43 can be a bundle of fiberoptic waveguides with one end at line focus 41 and the opposite end at detector 45. Detector 45, which may be a photomultiplier tube or other optical detector element, converts the light reaching it into an electrical signal.

The electrical signal is transmitted on line 47 to a computer 19, which correlates it to the position of the scanning beam 29 on the wafer 11. In one method suitable for unpatterned wafers, the computer 19 stores in its memory the beam positions where the detection signal exceeds some predetermined threshold. Other more complex position determining techniques known in the art can also be used to locate particles, especially on patterned wafers. Whatever method is used to obtain the positions of particles on the wafer 11, the positions are stored in the memory of computer 19 for use by particle removing elements 17.

The particle removing elements 17 include a second laser 51 selectively producing a laser beam pulse 53 in response to control signals on a line 55 from computer 19. Also included are directing and focusing optics, such as concave mirror 57 in FIG. 1 or lens system 56 in FIG. 2. Mirror 57 may be a scanning mirror whose orientation is controlled by computer 19. The beam 53 comes to a focus at a "point" 61, or more precisely an extremely small volume of high flux density, where a shock wave 63 is generated.

With reference to FIG. 2, the beam 53 from laser 51 is focused to "point" 61 by a lens 56 or other focusing element, such as concave mirror 57 in FIG. 1. The beam 53, after leaving focusing element 56 or 57, is characterized by a convergence angle $a_1$. Laser beams, like beam 53, are usually designed to be Gaussian. For a Gaussian beam of half width W passing through a lens with focal length f, the resulting angle of convergence $a_1 = 2W/f$ (in radians). After travelling approximately the focal length f, the converging beam reaches a minimum half width $W_f$, which for Gaussian beams is approximately $W_f \approx 2\lambda/\pi \, a_1$, where $\lambda$ is the wavelength of the beam. Shock waves 63 are produced when a beam pulse is focused down to a width $w_f$ which is sufficiently small that the peak power flux density of the pulse at the focus 61 exceeds the breakdown threshold of the gas. For air, the breakdown threshold is on the order of $10^{12} W/cm^2$. One can reduce the breakdown threshold by a proper choice of gases in a gas mixture. In any case, the convergence angle $a_1$ is selected so as to be large enough to produce the necessary power density at the focus to achieve breakdown. As noted above, the convergence angle is a function of the focal length of the focusing element 56 or 57.

When the gaseous constituents begin to break down, the gas ionizes and rapidly heats producing a shock wave front. For air, the peak pressure of the shock wave front is estimated to be approximately 10 MPa at the point of origin. Because the shock wave attenuates rapidly as it propagates outward from the point 61, the focal point 61 must be spaced close to the surface plane 65. The dominant adhesion force that holds particles of less than 100 $\mu$m diameter to a surface is the capillary force. This force is typically about 0.55 $\mu N/\mu m$-diameter. By contrast, Van der Waals force is about 0.18 $\mu N/\mu m$-diameter, assuming dry particles on a dry surface. Regardless of the cause of adhesion, to dislodge a particle 67 on the surface requires a pressure gradient across that particle which is sufficient to overcome the adhesion forces. For 10 $\mu$m particles, the peak pressure of the shock wave front at the surface needs to be only on the order of 0.07 MPa. The smaller 1 μm particles require a larger peak pressure on the order of 0.7 MPa. As seen in FIG. 2, the focal point 61, i.e. the point of origin of shock wave 63, is spaced a distance d above the plane 65 of the surface. Typically, the distance d is in a range from about 500–1000 μm. Laser induced shock waves in air have been demonstrated to remove 1 μm diameter polystyrene latex spheres on silicon when the distance d is less than 1 mm. Generally, the distance required depends on the size of the particles one wishes to remove. Thus, a distance d as great as 4 mm may be sufficient, if removal of particles smaller than about 10 μm diameter is determined to be unnecessary. Distances d less than 250 μm have potential for causing surface damage and are generally avoided.

For spherical particles with a diameter on the order of 1 μm, the particles' force of adhesion is on the order of $10^7$ times their own weight. Accordingly, once their bond with the substrate is broken by a force that exceeds the adhesion, the dislodged particles 69 are accelerated to high velocity. Because they are extremely small, the probability that dislodged particles 69 will resettle on the surface is very low. A flow of air may also be used to move dislodged particles 69 from the wafer area.

In addition to removing particles, it is essential that the method not damage the surface, nor vaporize any particles which may be on that surface. With reference to FIG. 3, in a typical beam pulse 70, the power flux density at the focal point begins at zero or a very low level and steadily rises toward a peak at 71. The flux density then falls back to zero. A typical pulse duration is about 4 nanoseconds. At first, the gas mixture at the focus is transparent. Once the flux density reaches a threshold 73 for breakdown of the gaseous constituents in the mixture, the gas becomes absorptive of the laser radiation and continues to be absorptive for some period after the flux density has fallen back below the threshold. For air at atmospheric pressure, the breakdown threshold is on the order of $10^{12} W/cm^2$. During the atmospheric transparency stage prior to ionization, the beam will impinge on the wafer surface and could potentially cause melting or ablation of the material surface. For any given type of surface, there is some power flux density at the surface, referred to herein as the damage threshold $D_{th}$, for which damage to the surface can occur. The peak power flux density at the surface depends upon a laser shock wave system's parameters, which include the incidence angle $\theta_1$, angle of convergence $a_1$ and distance d. It is an object of a good laser shockwave system to reduce the power flux density at the surface so that it is always below the damage threshold $D_{th}$. FIG. 3 shows two power flux density curves 72 and 74 for two arbitrary sets of laser shockwave system parameters. The power flux density at the surface begins at zero or a very low level and steadily rises with the beam pulse to a peak until gas breakdown occurs. Once the gas becomes absorptive of the laser radiation, the power flux density at the surface falls off rapidly to a lower level. For a first system, represented by curve 72, the peak power flux density 76 exceeds the damage threshold $D_{th}$. The region 75 in the graph corresponds to a period of potential damage. By contrast, a second system, represented by curve 74 has a peak power flux density 78 at the surface, which is below the damage threshold $D_{th}$, so no damage will occur.

With reference to FIGS. 2 and 4, the power density can be decreased by increasing the area 73 over which the beam impinges on the surface. In FIG. 2, the area 73 is increased by directing the beam 53 at a shallow incidence angle $\theta_1$. Generally, the convergence angle $a_1$ is selected to achieve gas breakdown, as noted above, while the spacing d is selected to achieve a large enough shock wave to dislodge particles. Accordingly, once these first two parameters are known, the incidence angle $\theta_1$ is chosen to be small enough that the illuminated area on the surface is sufficiently large to avoid surface damage. This may be determined experimentally with a test surface by reducing the incidence angle $\theta_1$ until no surface damage is observed. A typical incidence angle $\theta_1$ in FIG. 2 is in the range from 2 to 4 degrees. Using only s-polarization, indicated by symbol 72, minimizes power absorbed by the surface, and therefore potential damage.

Alternatively, in FIG. 4 the incidence angle $\theta_2$ may be near 90°. In this instance, the illumination area 73 on the surface is increased by increasing the divergence angle $a_2$. This may be done by increasing the numerical aperture of the lens system 56 until no surface damage is observed. If damage is still observed at the highest possible numerical aperture with the available lens systems 56, the laser power may be reduced to a point at which gas breakdown just still occurs at the focus, but where no damage is observed at the surface. One must check to see if particles are still being removed. If not, the spacing of the focal point 61 above the surface may have to be slightly decreased.

In operation, the apparatus in FIG. 1 removes particles in the following manner. The wafer 11 is disposed on the wafer support 13 and transported to particle detector 15 in the position shown in phantom. The location of each detectable particle on the surface is determined and stored in computer 19. Wafer 11 is then transported to the laser shock wave removal station as indicated by arrow 21. Responsive to signals on line 59 from the computer, the laser beam pulse 53 is directed and focused to point 63. A shock wave is thereby produced. The shock wave dislodges particles on the wafer surface that are proximate to the point 63. The pulses are repeated for each detected particle position until the wafer is clean.

Alternatively, shock waves may be produced in a sequence of positions forming a scan of the entire wafer. In this alternative, the particle positions are not detected and located. Other alternatives are also possible. Shock waves, for example, may be produced by means other than a focused laser beam.

I claim:

1. A method of removing microscopic particles from solid surfaces comprising,
    disposing a solid surface in a predetermined plane,
    locating a position of each particle on said surface,
    producing a gas-borne shock wave at a point proximate to said predetermined plane, said point at which said shock wave is produced being proximate to one said located position, particles on said surface near said point being removed from said surface by said shock wave, the production of said shock wave leaving said solid surface substantially undamaged, and
    repeating the shock wave producing steps at other said located positions for each additional particle which is detectable on said surface.

2. A method of removing microscopic particles from solid surfaces comprising, disposing a solid surface in a predetermined plane, and producing a gas-borne shock wave at a point proximate to said predetermined plane, any particles on said surface near said point being removed from said surface by said shock wave, the production of said shock wave leaving said solid surface substantially undamaged, wherein producing a shock wave comprises focusing and directing a laser beam pulse to said point, said beam pulse being focused to a small beam width such that said beam pulse has a peak power flux density at said point sufficient to cause breakdown of the gas at said point, said beam pulse being directed at an incidence angle $\theta$ sufficiently shallow to leave said solid surface substantially undamaged.

3. The method of claim 2 wherein said gas is air and said peak power flux density at said point is at least on the order of $10^{12}$W/cm$^2$.

4. A method of removing microscopic particles from solid surfaces comprising, disposing a solid surface in a predetermined plane, locating positions of particles on said surface, focusing and directing a laser beam pulse to a point above said plane proximate to one said located position, said focused beam pulse having an angle of convergence a such that a peak power flux density at said point exceeds a breakdown threshold of a gas at said point, whereby a shock wave originates at said point, said point being spaced a distance d above said predetermined plane such that a peak pressure gradient of said shock wave across said first particle exceeds adhesion forces between said particle and said surface, whereby said first particle is removed from said surface by said shock wave, said beam pulse being directed at an incidence angle $\theta$ such that a surface damage threshold exceeds said peak power flux density, and repeating the directing and focusing step for each additional particle which is located on said surface.

5. The method of claim 4 wherein said distance d is in a range from 250 to 4000 micrometers.

6. The method of claim 4 wherein said gas is air and said beam pulse has a peak power flux density at said point at least on the order of $10^{12}$W/cm$^2$, whereby breakdown of the air at said point occurs.

7. An apparatus for removing microscopic particles from a solid surface comprising, means for supporting an object, a solid surface of said object being disposed in a predetermined plane, means for locating particle positions on said surface, and means for producing shock waves at selected points proximate to said plane, said means for producing shock waves being responsive to said locating means so as to select said points proximate to said particle positions, said shock waves having peak pressures sufficient to dislodge particles on said surface proximate to said selected points.

8. An apparatus for removing microscopic particles from a solid surface comprising, means for supporting an object, a solid surface of said object being disposed in a predetermined plane, and means for producing shock waves at selected points proximate to said plane, said shock waves having peak pressures sufficient to dislodge any particles on said surface proximate to said selected points, wherein said means for producing shock waves includes means for selecting said points proximate to said plane in a scan of said wafer surface.

9. An apparatus for removing particles from a solid surface comprising, means for supporting an object, a solid surface of said object being disposed in a predetermined plane, means for locating positions of particles on said surface, a laser for selectively producing laser beam pulses, and means responsive to said locating means for focusing and directing said beam pulses to successive points above said surface proximate to said positions of said particles, whereby shock waves are produced at said points so as to dislodge said particles from said surface, said beam pulses being directed at an incidence angle $\theta$ with respect to said predetermined plane such that a surface damage threshold is not exceeded.

10. The apparatus of claim 9 wherein said points are in a range from 250 to 4000 micrometers above said wafer surface.

11. The apparatus of claim 9 wherein said laser beam pulses are focused to a small beam width such that a peak power flux density at said points is at least as large as a breakdown threshold of a gas at said points.

12. The apparatus of claim 11 wherein said gas is air and said peak power flux density exceeds on the order of $10^{12}$W/cm$^2$ at said points.

* * * * *